July 25, 1967
I. L. FISCHER
3,333,106
CIRCUIT FOR IMPROVING THE SIGNAL-TO-NOISE RATIO OF PHOTOELECTRIC DEVICES
Filed May 1, 1964
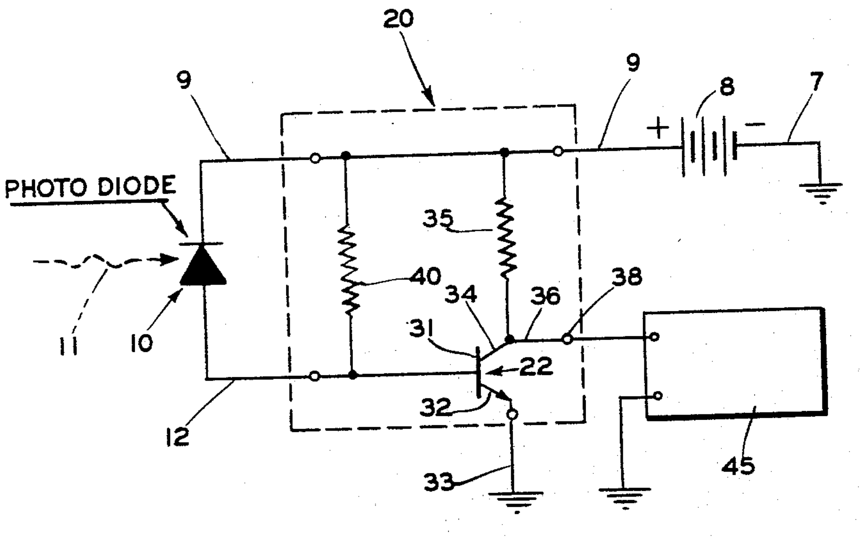
INVENTOR
ISRAEL L. FISCHER
BY Herbert L. Davis
ATTORNEY United States Patent Office
3,333,106
Patented July 25, 1967

3,333,106
CIRCUIT FOR IMPROVING THE SIGNAL-TO-NOISE RATIO OF PHOTOELECTRIC DEVICES

Israel L. Fischer, Harrington Park, N.J., assignor to The Bendix Corporation, Teterboro, N.J., a corporation of Delaware
Filed May 1, 1964, Ser. No. 364,212
3 Claims. (Cl. 250—214)

ABSTRACT OF THE DISCLOSURE

An electronic network having an electrical cutoff frequency and including a photodiode having an electrical cutoff at a predetermined frequency of applied light signals, and in which the network electrical cutoff frequency is greater than that of the photodiode, so as to provide a response to the frequency of a radiation impinging upon the photodiode when such radiation is of a frequency greater than the cutoff frequency of the photodiode, and for improving the signal-to-noise ratio of the photodiode network, comprising a transistor amplifier including first and second resistors, the first resistor being connected in parallel with the photodiode and connected between a source of electrical energy and a base of the transistor, the second resistor being connected between the source of electrical energy and another element of the transistor, the first resistor being used to control the input impedance to the transistor amplifier thereby determining the signal-to-noise ratio and cutoff frequency of the network by compensating for the junction capacitance of the photodiode and allowing the electronic network to respond to light signal radiations of a frequency greater than the cutoff frequency of the photodiode, and the second resistor providing a suitable output impedance for connection to subsequent stages of electronics.

The invention relates generally to photoelectric devices and more particularly to a circuit for improving the signal-to-noise ratio of photoelectric devices in responding to pulsating light signals at high frequencies and to improvements in an amplifying circuit for a photoelectric device of a type such as disclosed and claimed in a copending U.S. application Ser. No. 193,989, filed May 11, 1962, by Israel L. Fischer, Richard Wolfson, and Edward Kresch, now U.S. Patent No. 3,247,388, granted Apr. 19, 1966, and assigned to The Bendix Corporation.

Photoelectric devices convert light signals into electrical signals and may be utilized in a subminiature optical pickup of a type disclosed and claimed in a copending U.S. application Ser. No. 362,836, filed Apr. 27, 1964, by Bernard Spieker, Israel L. Fischer, Walter W. Lee, and Thomas J. Meloro, and assigned to The Bendix Corporation.

An object of the invention is to provide a novel circuit, using a photoelectric device, to obtain a highly accurate response from the photoelectric device while minimizing the random fluctuations in the electrical signal provided by the photoelectric device.

Another object of the invention is to provide a novel circuit including a photoelectric device for amplifying and minimizing noise in electrical signals effected by a light sensing device so that such signals may more accurately correspond in shape, relative amplitude and time phase to that of the light signals applied to the photoelectric device.

Another object of the invention is to provide a novel circuit including a photoelectric device providing electrical signals from light signals of a frequency greater than the cutoff frequency of the photoelectric device and including means to correct for the inherent junction capacitance of the light sensing device within the normal operating frequency of the device.

The invention contemplates a circuit including a photoelectric device, signal amplifier and biasing network so arranged as to minimize the amount of so-called Shot and Johnson noise injected into the amplifier input thus providing usable signal-to-noise ratios.

The foregoing and other objects and advantages of the invention will appear more fully hereinafter from a consideration of the detailed description which follows, taken together with the accompanying drawing wherein one embodiment of the invention is illustrated by way of example. It is to be expressly understood, however, that the drawing is for the purpose of illustration only and is not to be construed as defining the limits of the invention.

The drawing is a schematic diagram of a novel circuit including a photoelectric device and an amplifier constructed in accordance with the invention.

The novel circuit constructed in accordance with the present invention and shown in the drawing comprises a source of electrical potential or battery 8 of a value E and having a negative terminal connected by a conductor 7 to ground and a positive terminal connected by a conductor 9 to the cathode of a photoelectric device 10 which, for example, may be of a conventional type formed of silicon, germanium or other suitable material. A light signal 11 falling on diode 10 generates electrons and holes within the diode junction, and the potential from source 8, impressed on diode 10, provides a current signal in accordance with the current carriers generated within the diode.

The current signal from photodiode 10 is applied through a conductor 12 leading from the anode of the photodiode 10 to an amplifier 20. Amplifier 20 includes a transistor 22 having a base 31 connected by conductor 12 to the anode of the diode 10 for receiving the current signal, an emitter 32 connected through a conductor 33 to ground and thereby to the negative terminal of the battery 8, and a collector 34 connected through a resistor 35 to a conductor 9 leading to the positive terminal of the source of potential 8. An output conductor 36 leads from between the collector 34 and the resistor 35 to an output terminal 38. An output signal is provided between the grounded emitter 32 and the output terminal 38. A resistor 40 is connected between the lines 9 and 12.

The circuit shown schematically in the drawing provides amplification of extremely small signals and is particularly directed to the provision of a novel means for amplifying and minimizing random fluctuations in an electrical signal from a light sensing device such as the photodiode 10 so as to provide electrical signals from light signals of a frequency greater than the cutoff frequency of the photodiode 10.

Previous to the provision of the simple circuit of the present invention in cooperation with the photodiode 10, simple circuits were not available which would effect proper compensation for random fluctuations in the electrical signal from the photodiode 10 while at the same time effecting a usable signal-to-noise ratio. The circuit of the present invention is so arranged as to provide a particular load impedance to the photodiode 10 in order to correct for the inherent junction capacitance of the light sensing device 10. The biasing network includes the resistor 40 having a resistance value $R_1$ and is so arranged as to minimize the amount of random fluctuations in the electrical signal injected into the input of the amplifier 20 arising from so-called Shot noise due to the discrete nature of the electron flow as well as the effect of the thermal energy of the electrons or so-called Johnson thermal noise effect.

The resistor 35 has a value $R_2$ such as to provide a proper output impedance to the succeeding stages of electronics indicated generally by the numeral 45.

The amplifier circuit is designed to achieve simultaneously an optimum balance between signal-to-noise ratio and frequency cutoff of the output signal of the photodiode 10. As is known to those skilled in the state of the art, increasing the input impedance of the amplifier transistor 22 improves the signal-to-noise ratio, but simultaneously degenerates the frequency cutoff of the system because of the existence of an intrinsic or inherent capacitance in the photodiode 10. Therefore, there is an optimum value of this input impedance such that the frequency response is sufficient to meet the needs of the system, while the signal-to-noise ratio is as high as possible.

The combination of resistor 40 having a resistance value $R_1$, resistor 35 having a resistance value $R_2$, and transistor 22 provides a current biased grounded emitter amplifier. In a current biased grounded emitter circuit, as shown, the input impedance Z of the transistor 22 is essentially independent of transistor parameter variations so long as the value $R_1$ of the base bias resistor 40 and the value E of the supply voltage from the battery 8 are reasonably constant. Therefore, once the optimum value of Z of the transistor 22 has been determined, the value $R_1$ of the resistor 40 can be specified with the assurance that variations in Z from circuit to circuit will be minimal. The value $R_2$ of the load resistor 35 is chosen to provide proper output impedance to the succeeding stages of electronics 45, and does not enter into the calculation described above except as a minor correction. In other words, "Miller capacitance" is not an important criterion here.

*Formulas*

In a tuned circuit such as in the U.S. Patent No. 3,247,388 issued Apr. 19, 1966, to Israel L. Fischer, Richard Wolfson and Edward Kresch, tuning at the input terminals is obtained by the combination of a load inductance and the intrinsic collector-to-base (Miller) capacitance of the transistor. In the circuit shown here, the Miller capacitance is of negligible importance. The input impedance is determined by the passive resistor 40 of the value $R_1$. I have found as a fact that the current biased common emitter circuit, as shown, has an input impedance which is essentially independent of transistor variations. As a practical approximation, the following formulas are valid. The bias current flow into the base terminal is given by the relationship $E/R_1$. This current flow is amplified by the transistor gain B so that the emitter current flow is $BE/R_1$. The impedance looking into the emitter 32 of transistor 22 is given by the well-known formula $kT/qI_e$ where $k$ is the Boltzmann constant; T is the absolute temperature; $q$ is the electronic charge; and $I_e$ is the aforementioned emitter current.

For silicon at room temperature, $kT/q$ can be replaced by the empirical value of .04 volt. For germanium, $kT/q$ empirically turns out to be .025 volt which is in close agreement with theory. The reason for silicon being empirically somewhat different from the theory is not presently explained but is a well-established fact.

Combining the last two formulas, we obtain for the impedance looking into the emitter the value $kTR_1/qBE$.

The impedance looking into the base 31 of the transistor 22 (the input impedance of importance in this circuit) is essentially B times the impedance looking into the emitter or $Z=kTR_1/qE$. The value of the transistor current gain (B) has cancelled out in this practical approximation so that, as previously stated, variations in transistor parameters do not have a significant effect on the input impedance of the common emitter stage. Only the empirical value of $kT/q$ and the design values of the supply voltage E and the passive resistor $R_1$ enter into the final formula.

The upper frequency cutoff of the circuit is now determined by the combination of diode capacitance and transistor input impedance via the well-known formula $$f_{\text{cutoff}}=\frac{1}{2\pi ZC}$$

where Z is given above and C is the combination of diode and transistor capacitance. Thus, the value of Z must be small enough so that cutoff frequency of the circuit is slightly above the highest frequency of radiation 11 to which it is desired to have the system respond; on the other hand, the largest possible value of Z should be used in order to enhance the signal-to-noise ratio of the circuit.

The thermal or Johnson noise in a circuit of this kind is much larger than the input impedance of the transistor given by the well-known formula $$v^2_{\text{thermal}}=4kTf_{\text{cutoff}}Z$$

The Shot noise is given by $$i^2_{\text{Shot}}=2qI_bf_{\text{cutoff}}$$

where $I_b$ is the direct current flow in the base 31 of the transistor 22. By using relationships derived above, the Shot noise can be rewritten as $$v^2_{\text{Shot}}=i^2_{\text{Shot}}Z^2=2kTf_{\text{cutoff}}Z$$

Hence, the total random noise is given by $$v_{\text{noise}}=v^2_{\text{thermal}}+v^2_{\text{Shot}}=6kTf_{\text{cutoff}}Z$$

The signal at the base 31 of the transistor 22 is given by the formula $v_{\text{signal}}=I_dZ$, where $I_d$ is the current produced by the diode 10 in response to a light signal 11 and is essentially independent of the way the diode 10 is loaded. The signal-to-noise ratio, therefore, is obtained by dividing the two previous equations to obtain $$\frac{v_{\text{signal}}}{v_{\text{noise}}}=\frac{I_d}{\sqrt{6kTf_{\text{cutoff}}}}\sqrt{Z}$$

As can be observed, an increase in input impedance causes the signal-to-noise ratio to increase.

In summary then, the goal of this circuit is to obtain reliably an input impedance presented to the photodiode 10 that will enhance the signal-to-noise ratio as much as possible without causing excessive degradation of frequency and to obtain this proper match with a minimal dependence on transistor variations. The circuit, as shown, can therefore be duplicated without selecting transistors or other components and will consistently perform as required.

Although only one embodiment of the invention has been illustrated and described, various changes in the form and relative arrangement of the parts, which will now appear to those skilled in the art may be made without departing from the scope of the invention. Reference is, therefore, to be had to the appended claims for a definition of the limits of the invention.

What is claimed is:

1. A circuit comprising a photodiode adapted to change resistance in accordance with an applied light signal and having a cutoff frequency, a source of potential connected to the diode for providing current in accordance with the resistane of the diode, a reference potential, a transistor having a base connected to the diode for receiving the current signal, an emitter connected to the reference potential, and a collector, first means including a resistor providing an output impedance connected between the collector and the source of potential, second means including a resistor connected between the base and the source of potential to reduce random fluctuations in the current signals due to effects of electron flow and thermal energy, and said first and second means so arranged in said circuit as to provide usable electrical output signals over a frequency range greater than the cutoff frequency of the photodiode.

2. In a circuit of a type including a photodiode adapted to change resistance to effect current signals in accordance with an applied light signal and to cut off the current signals at a predetermined frequency of the applied light signal, a source of potential connected to the diode for providing the current signals in accordance with the resistance of the photodiode, a transistor having a base, an emitter and a collector, means to connect the base to the diode for receiving the current signals, first means to connect the emitter and the collector across the source of potential, and said first means including a resistor providing an output impedance; the improvement comprising second means including a resistor connected between the base and the source of potential and across the photodiode to so control an input impedance to the transistor as to reduce random fluctuations in the current signals, and the second means being so arranged in the circuit in relation to said first means as to cause the circuit to provide usable output current signals over a frequency range of the applied light signal greater than that of the predetermined cut off frequency of the photodiode.

3. A circuit comprising a photoelectric device and a source of electrical energy to provide electric signals in accordance with frequency of light signals applied to the photoelectric device and having a cutoff frequency at a predetermined frequency of the applied light signals, and an amplifier including a transistor, the transistor having an input connected to the photoelectric device for receiving the electric signals, the circuit including a network to minimize random fluctuations in the electrical signal and providing usable electrical output signals from the photoelectric device in accordance with the frequency of the applied light signals, said amplifier including a transistor having base, emitter and collector elements, the base element being operatively connected to receive the electrical output signals from the photoelectric device, means connecting the collector and emitter elements across the source of electrical energy, and a resistor connected between the source of electrical energy and the base and across the photoelectric device to determine input impedance to the transistor and to minimize random fluctuations in the electrical signals provided to said transistor from the photoelectric device due to effects of electron flow and thermal energy in the photoelectric device.

References Cited

UNITED STATES PATENTS

| | | | |
|---|---|---|---|
| 2,947,873 | 8/1960 | Borden ---------- | 250—214 X |
| 2,966,594 | 12/1960 | Hinz et al. ------- | 250—214 X |
| 3,093,740 | 6/1963 | Bush ------------ | 250—214 X |
| 3,268,732 | 8/1966 | Grieder ----------- | 250—206 |

RALPH G. NILSON, *Primary Examiner.*

M. A. LEAVITT, *Assistant Examiner.*